(12) United States Patent
Schulze et al.

(10) Patent No.: US 7,754,590 B2
(45) Date of Patent: Jul. 13, 2010

(54) METHOD OF MANUFACTURING A SEMICONDUCTOR DEVICE COMPRISING A FIELD STOP ZONE AT A SPECIFIC DEPTH

(75) Inventors: Hans-Joachim Schulze, Ottobrunn (DE); Holger Schulze, Villach (AT); Andreas Kyek, Sinzing (DE)

(73) Assignee: Infineon Technologies Austria AG, Villach (AT)

( * ) Notice: Subject to any disclaimer, the term of this patent is extended or adjusted under 35 U.S.C. 154(b) by 145 days.

(21) Appl. No.: 11/468,372

(22) Filed: Aug. 30, 2006

(65) Prior Publication Data

US 2008/0124902 A1     May 29, 2008

(51) Int. Cl.
    *H01L 21/265*    (2006.01)

(52) U.S. Cl. .................. 438/520; 438/518; 438/528; 257/E21.345

(58) Field of Classification Search .......... 438/518, 438/520, 522, 525, 528, 530; 257/E21.345
See application file for complete search history.

(56) References Cited

U.S. PATENT DOCUMENTS

| | | | | |
|---|---|---|---|---|
| 5,637,511 | A * | 6/1997 | Kurihara | .................. 438/79 |
| 2005/0181552 | A1 * | 8/2005 | Koyama | .................. 438/163 |
| 2005/0215042 | A1 * | 9/2005 | Hille et al. | .............. 438/606 |
| 2006/0081923 | A1 * | 4/2006 | Mauder et al. | ........... 257/335 |
| 2006/0205122 | A1 * | 9/2006 | Schulze et al. | ........... 438/133 |

FOREIGN PATENT DOCUMENTS

| | | |
|---|---|---|
| DE | 10239312 | 3/2004 |
| DE | 102005007599 | 11/2006 |

OTHER PUBLICATIONS

Robb et al., "Increasing the Witching Speed of High-Voltage IGBTs," Motorola, Inc. SPS, Power Products Division, IEEE, 1997, pp. 251-254.*
"German Patent Application Serial No. 15098192 Office Action mailed Mar. 6, 2007 with English translation", 3 pgs.

* cited by examiner

*Primary Examiner*—Ha Tran T Nguyen
*Assistant Examiner*—Daniel Whalen
(74) *Attorney, Agent, or Firm*—Schwegman Lundberg & Woessner, P.A.

(57) ABSTRACT

Some embodiments of the invention relate to manufacturing a semiconductor device with an implantation layer on a semiconductor substrate including a method of manufacturing such an implantation layer, wherein said implantation layer is formed in an implantation step at a predetermined depth of penetration, determined from a top surface of said semiconductor substrate, using a particle beam, by increasing its path distance to a main implantation peak and correspondingly increasing the energy level of said particle beam for producing an undamaged implantation layer having a thickness that is increased significantly compared with the thickness of an implantation layer that would be produced at said predetermined depth of penetration using a particle beam with non-increased path distance and energy level.

34 Claims, 5 Drawing Sheets

METHOD OF MANUFACTURING A SEMICONDUCTOR DEVICE COMPRISING A FIELD STOP ZONE AT A SPECIFIC DEPTH

TECHNICAL FIELD

The various embodiments described herein relate to the field of semiconductor devices generally, including methods of producing field stop zones in such devices.

BACKGROUND INFORMATION

Today, the IGBT (Insulated Gate Bipolar Transistor) is a popular semiconductor switch, which is available for power applications. There are three different types of the IGBT known as the PT-IGBT (Punch Through), the NPT-IGBT (Non-Punch Through) and the FS-IGBT (Field Stop).

Furthermore, conventionally a field stop zone is formed within a substrate by thinning the substrate to a precise thickness, implanting an "end-type" dopant, such as phosphorous or arsenic, into the bottom surface of the substrate, followed by high temperature anneal (usually at more than about 600° C.) to activate the dopant. It is known that multiple proton implantations can be used to produce a field stop zone. Here, hydrogen is implanted into a predetermined depth of a substrate, where the hydrogen behaves as an $n^+$-dopant after the implant damage is annealed out. Implantation energies are usually less than 500 keV. Also, donors are generated in a so called "end-of-range region" of the semiconductor device, as well as any other region effected by the proton implantation. Here, the higher the proton implantation energy, the more donors are generated.

Therefore, it is advantageous that a field stop zone, especially within IGBT semiconductor devices, is formed in such a way as to create a sufficient junction barrier within the semiconductor device and having adequate dynamic properties.

DETAILED DESCRIPTION

In the following detailed description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

The three basic prior art IGBT types, as mentioned above, are shown in FIG. 1, FIG. 2, and FIG. 3.

Figure 1:
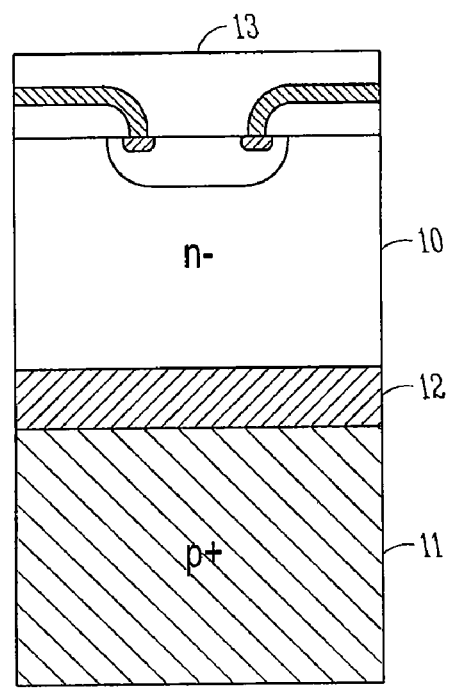
FIG. 1 illustrates an example of an PT-IGBT.

Here, FIG. 1 illustrates a typical PT-IGBT comprising an $n^-$-epitaxial wafer 10, a highly doped $p^+$-substrate 11, a stop zone 12 that is arranged between said $n^-$-epitaxial substrate 10 and said highly doped $p^+$-substrate 11, and a DMOS structure 13 that is arranged on a top surface of said $n^-$-epitaxial substrate 10.

Figure 2:
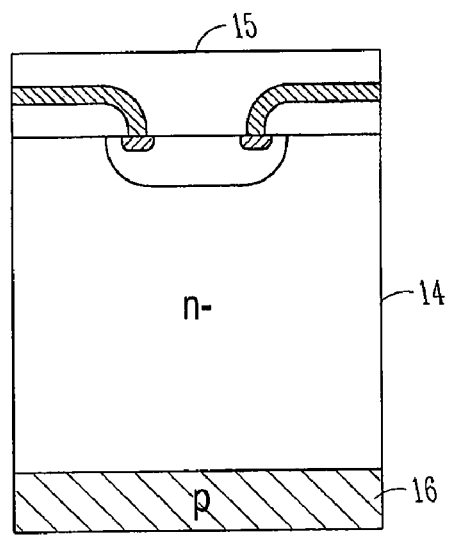
FIG. 2 illustrates an example of an NPT-IGBT.

A typical NPT-IGBT, as illustrated in FIG. 2, comprises a homogeneously doped substrate 14, for example $n^-$-substrate, a DMOS structure 15 that is arranged on a top surface of said homogeneously doped substrate 14 and a $p^-$-doped emitter 16 that is arranged on a second surface of said homogeneously doped substrate 14. Here, the substrate 14 is grinded down as thin as being required by the maximum break-down voltage, wherein said $p^-$-doped emitter 16 is implanted after said substrate 14 is processed to requirement.

Figure 3:
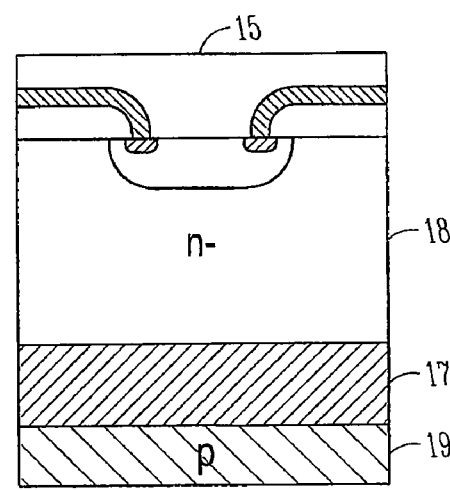
FIG. 3 illustrates an example of an FS-IGBT.

A typical FS-IGBT, as illustrated in FIG. 3, can be understood as a combination of a PT-IGBT and an NPT-IGBT. When using a field stop zone 17, generally having a much lower doping concentration as the stop zone shown in FIG. 1, an additional higher doped n-region is incorporated between a lower doped $n^-$-region 18 and a $p^-$-region 19 causing the electric field across the wafer to be reduced to zero. Therefore, the so called "Punch-Through effect" can be eliminated. Furthermore, by using a field stop zone 17, the thickness of the wafer can be reduced by up to 30% compared to a typical NPT-IGBT.

Figure 4:
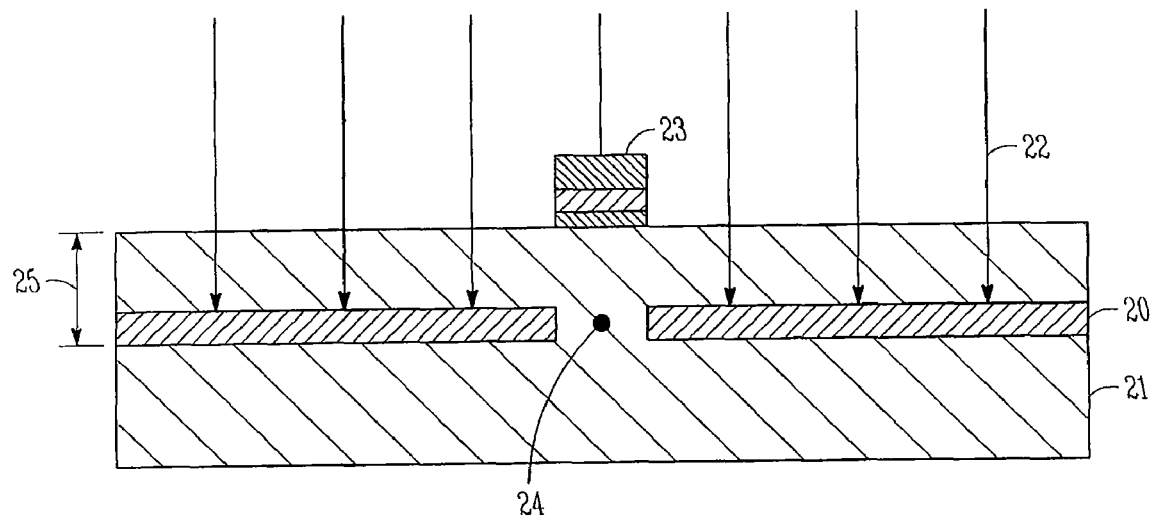
FIG. 4 illustrates schematically a method of producing a field stop zone at a predetermined depth of penetration.

A method of producing a field stop zone 20 is illustrated schematically in FIG. 4. Here, a substrate 21 is irradiated by proton beams 22 that are directed perpendicularly to a top-surface of the substrate 21. Particles 23 lying on the top-surface of said substrate 21 could cause holes 24 to form within the field stop zone generated at a specific depth 25, leading to a significantly increased leakage current.

Figure 5:
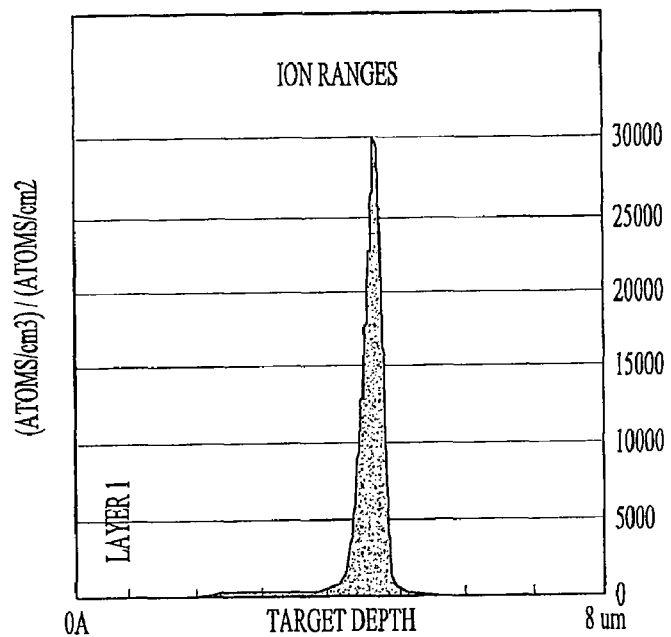
FIG. 5 shows a diagram illustrating the proton distribution within the field stop zone at a predetermined depth of penetration after a proton implantation with a proton beam directed perpendicularly to a top surface of the substrate.

FIG. 5 is a diagram of the donor distribution at a specific depth of said substrate 21 generated by the method shown in FIG. 4 using an implantation energy of 400keV and an angle of incidence of 90°, referred to the top surface of said substrate 21.

Figure 6:
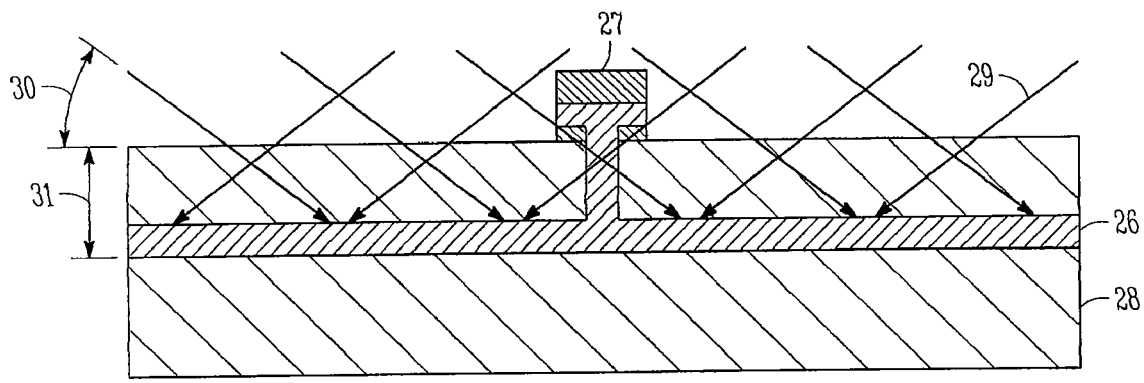
FIG. 6 illustrates schematically an embodiment of the present invention for a method of producing a field stop zone at a predetermined depth of penetration.

FIG. 6 illustrates schematically an example of a method for producing a broadened field stop zone 26 without damages through holes. Here, a proton beam 29, having an angle of incidence 30 that is different from 90°, is applied to a wafer 28. Therefore, the path of the proton beam 29 through the wafer 28 is increased. Hence, a higher energy level of the proton beam 29 is required in order to reach a predetermined depth of penetration 31 causing a significant increase in lateral and vertical dispersion of the protons. In addition, the vertical distribution of the donors is increased by using a proton beam 29 with an angle of incidence that is different from 90° adding the dispersion perpendicular to the axis of the proton beam 29 ("lateral straggling") to the vertical distribution of the donors.

Alternatively, the proton beam used in the method illustrated in FIG. 6 can be adjusted successively to angles of incidence of e.g. 20°, 40°, 60° and 80° during proton implantation using energy levels that are adjusted respectively to reach the predetermined depth of penetration. Hence, a field stop zone is produced that is broadened, undamaged and has a flattened doping profile. Also, the lateral straggling (dispersion perpendicular to the axis of the proton beam 29), mainly responsible for increased distribution of the donors, is increased significantly compared to the longitudinal straggling (dispersion longitudinal to the axis of the proton beam 29) at proton implantation at energy levels of about 100 keV up to about 1 MeV.

Furthermore, In some embodiments, the proton beam 29 illustrated in FIG. 6 has an angle of incidence 30 of about 45°, passing not only underneath but, because of the higher energy levels, also through particles 27 lying on the top surface of the wafer 28, preventing forming of holes in the field stop zone 26. The field stop zone 26 has different concentration peaks of the implanted donors parallel to the top surface of the substrate 28 that are caused by vertical and lateral dispersion. This so-called "waviness" of the field stop zone 26 can be minimized using acute angles of incidence 30 and corresponding increased energy levels for the particle beam 29.

Figure 7:
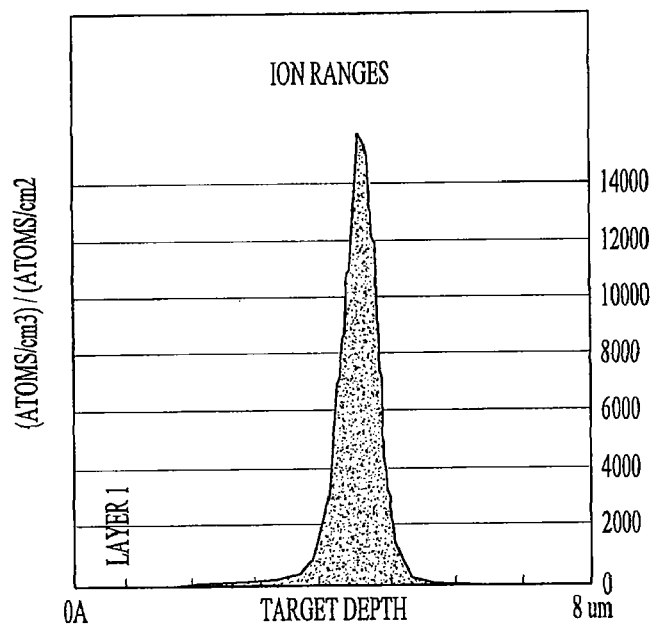
FIG. 7 shows a diagram that illustrates the proton distribution within the field stop zone at a predetermined depth of penetration after proton implantation with an angle of incidence that is different from 90°.

FIG. 7 illustrates a diagram showing the distribution of donors at a specific depth of penetration 31 after proton implantation using embodiments of the method described above. The width of the donor peak is increased significantly compared with the donor peak shown in FIG. 5.

Figure 8:
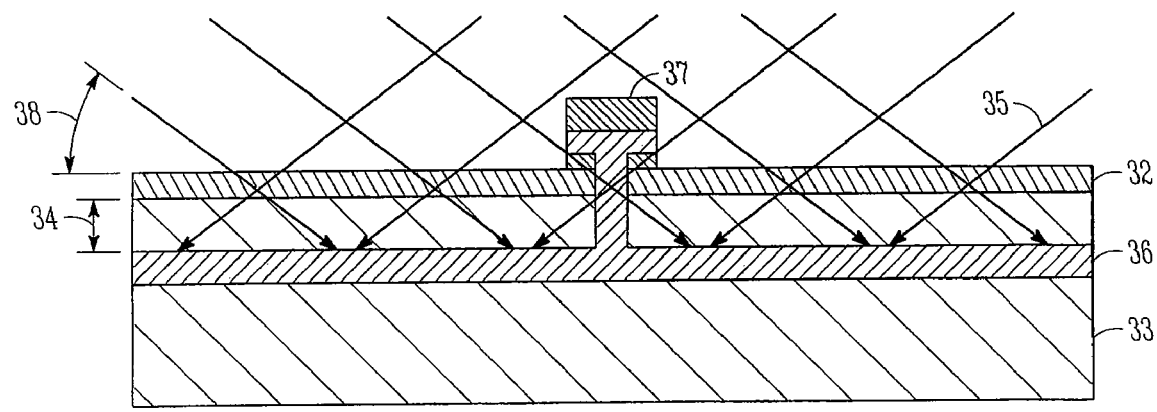
FIG. 8 illustrates schematically a further embodiment of the present invention for a method of producing a field stop zone at a predetermined depth of penetration using a proton beam with an angle of incidence that is different from 90°.
Figure 9:
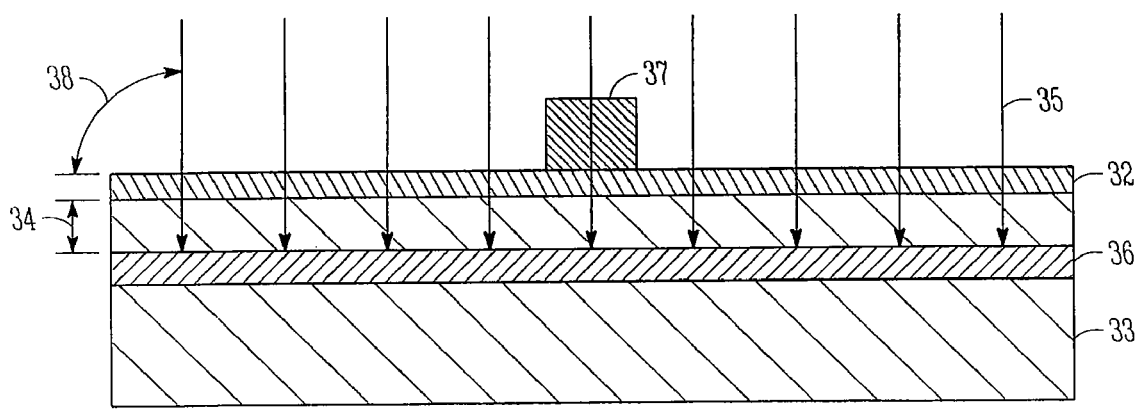
FIG. 9 illustrates schematically an embodiment of the present invention for a method of producing a field stop zone at a predetermined depth of penetration using a proton beam with an angle of incidence of 90°.

FIG. 8 and FIG. 9 illustrate some embodiments, using an absorption layer 32, e.g. silicon, $SiO_2$, a photoresist, or a metal layer, to increase the path through the substrate 33 to a specific depth of penetration 34, thus, allowing the energy level of the proton beam 35 to be increased significantly, resulting in formation of a broadened and undamaged field stop zone 36. Embodiments wherein there is an increased energy level, enable the proton beam 35 to pass through and underneath particles 37 usually lying on the top surface of the substrate 33. The angle of incidence of the proton beam 35 can be perpendicular to the top surface of the wafer 33 or differ from 90°. In some embodiments, the absorption layer 32 is removed after proton implantation.

In some embodiments, said field stop zone is formed in an implantation step at a predetermined depth of penetration, starting from a top surface of said semiconductor substrate, using a particle beam, a proton beam in particular, by increasing its path distance to a main implantation peak and correspondingly increasing the energy level of said particle beam producing an undamaged implantation layer having a thickness that is increased significantly compared with the thickness of an implantation layer that is produced at said predetermined depth of penetration using a particle beam with non-increased path distance and energy level.

In some embodiments, when producing implantation layers, e.g. field stop zones, particularly in IGBT's, a donor peak that is closest to the top surface of the substrate is broadened due to a higher implantation energy. Due to a non-perpendicular directed particle beam having a beam direction that varies around a normal direction on a cone-shaped shell, preventing formation of holes due to particles lying on the top surface of the substrate. Thus, in some embodiments, the path distance of said proton beam through the substrate is increased in such a way that the reached specific depth of penetration is the same as if a perpendicular proton beam is used with considerable lower implantation energy.

In some embodiments, the path distance through the semiconductor substrate is increased by using a particle beam with an angle of incidence that is different from 90° with reference to the top surface of the substrate. This allows the use of higher implantation energy in order to reach the predetermined depth of penetration causing also a significantly increased vertical and lateral dispersion of the particles, e.g. protons. In some embodiments, an angle of incidence between about 30° and about 75° is chosen.

Also, in some embodiments where the particle beam angle has an angle of incidence that is different from 90°, the particles are dispersed in a direction that is perpendicular to the particle beam, the so called lateral straggling. In addition, because of the higher implantation energy, the particle beam not only passes through unavoidable particles lying on said top surface, but also passes underneath said particles further improving the continuity of the field stop zone.

In some embodiments, it is possible to adjust the angle of incidence during implantation to a plurality of different angles in a range between about 90° and about 10°. In other embodiments the angle is adjusted between about 75° and about 30°. Such adjusting allows broadening the concentration "peaks" of the implantation layer or field stop zone in some embodiments, in such a way that, at least at a specific depth of penetration, a roughly continuous doping profile is produced instead of individual "peaks", as distinguished from multiple peaks which may be characteristic of multiple-implantation.

In an embodiment of the invention, a plurality of implantation sub-steps is used with a particle beam having different angles of incidence and corresponding different energy levels and/or the semiconductor substrate is rotated in a plane parallel to the top surface of the substrate during the implantation step and/or sub-steps in such a way that the particle beam impinges on the top surface at a plurality of different azimuth angles, allowing an even further improvement of the continuity of the field stop zone.

In some embodiments of the invention, additional implantation steps are performed using the same or a different particle beam with a different energy level and/or a different path distance through the substrate forming secondary implantation peaks in addition to the main implantation peak at depths of penetration that are greater than the depth of penetration of the main implantation peak. In some embodiments, the impurity concentration of the secondary implantation peaks is lower than the impurity concentration of the main implantation peak. However, in some embodiments, at least one secondary peak has an impurity concentration that is higher than the impurity concentration of the main implantation peak. Furthermore, in some embodiments, the above mentioned methods for broadening the main peak can also be applied to the secondary peaks.

Therefore, it is advantageous that a field stop zone, especially within IGBT semiconductor devices, is formed in such a way as to create a sufficient junction barrier within the semiconductor device and having adequate dynamic properties.

Figure 10:
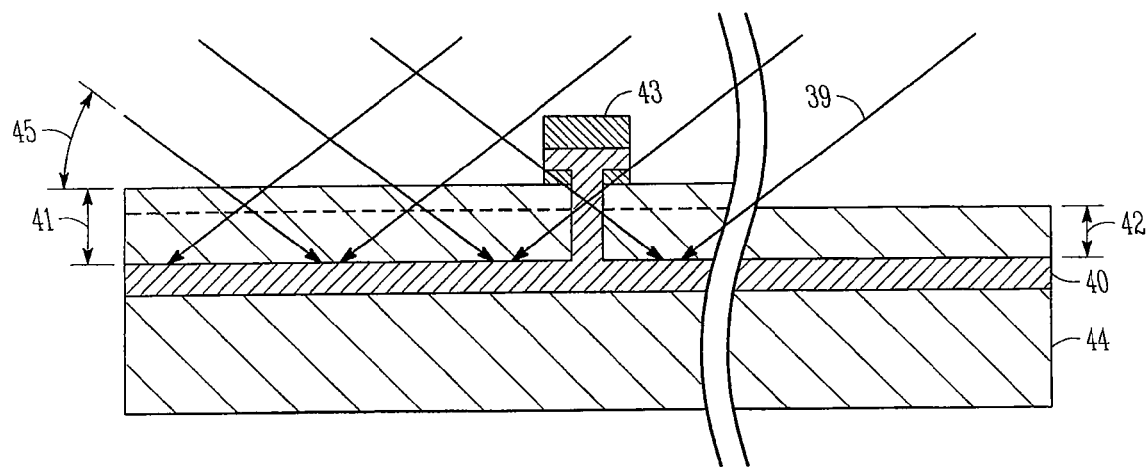
FIG. 10 illustrates schematically a further embodiment of the present invention for a method of producing a field stop zone at a predetermined depth of penetration using a proton beam with an angle of incidence that is different from 90°.
Figure 11:
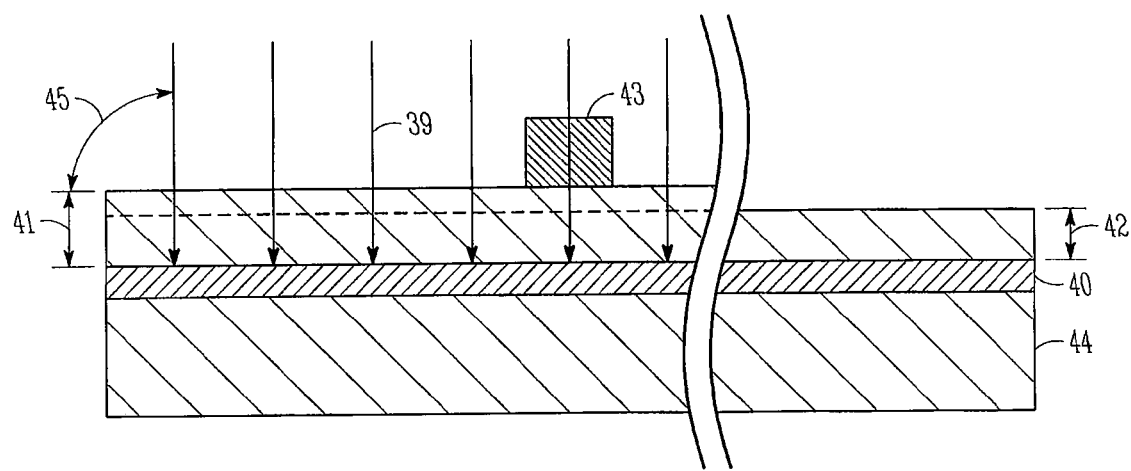
FIG. 11 illustrates schematically an embodiment of the present invention for a method of producing a field stop zone at a predetermined depth of penetration using a proton beam with an angle of incidence of 90°.

FIG. 10 and FIG. 11 illustrate some embodiments, where a proton beam with a higher energy level is used to produce a broadened and undamaged field stop zone 40 at a depth of penetration 41 that is greater than the specific depth of penetration 42. The higher energy levels allow the proton beam 39 to pass through and underneath particles 43 lying on a top surface of the substrate 44. After proton implantation, excess material of the substrate 44 is removed, e.g. by etching, from the top surface resulting in a field stop zone 40 that is allocated at the specific depth of penetration 42. The angle of incidence 45 can be perpendicular to the top surface of the wafer 33 or differ from 90°.

In some embodiments the absorption layer allows the use of particle beams with higher energy levels that can penetrate through any particle laying on the surface of the substrate in order to generate an undamaged field stop zone at the predetermined depth of penetration with reference to the top surface of the substrate. In some embodiments, the absorption layer or the deposited layer can be removed after implantation.

Embodiments of the invention provide methods of manufacturing an implantation layer at a specific depth of a semiconductor substrate improving short circuit withstandability and minimizing leakage current and embodiments of a methods of manufacturing a semiconductor device with improved short circuit withstandability and minimized leakage currents.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. A method of manufacturing an implantation layer in a semiconductor substrate, comprising:

increasing a path distance of a particle beam through the semiconductor substrate to a main implantation peak; and increasing an energy level of said particle beam through the semiconductor substrate, therefore forming an undamaged implantation layer in the semiconductor substrate, said implantation layer having a first thickness, wherein said implantation layer is formed at a predetermined depth of penetration relative to a top surface of the semiconductor substrate, wherein said first thickness of said implantation layer is larger than a second thickness of an implantation layer produced at the same predetermined depth of penetration relative to said top surface of the semiconductor substrate while employing a particle beam of non-increased path distance and non-increased energy level, wherein said particle beam is incident on said top surface of said semiconductor substrate, wherein a main donor peak is formed at said predetermined depth of penetration as a result of an annealing step carried out at a temperature less than 5000° C., after said implantation layer has been formed, and wherein said path distance is increased by using said particle beam having an angle of incidence different than 90° with reference to said top surface.

2. The method according to claim 1, wherein said particle beam is a proton beam used for proton implantation.

3. The method according to claim 1, wherein said angle of incidence is between 75° and 30°.

4. The method according to claim 1, wherein said angle of incidence is adjusted with reference to said top surface to at least one of a plurality of values, during said formation of the implantation layer between 90° and 10°.

5. The method according to claim 4, wherein said angle of incidence is adjusted to a plurality of values between 75° and 30°.

6. The method according to claim 4, further comprising a plurality of implantation sub-steps using a particle beam with a plurality of distinct angles of incidence for each sub-step, and a plurality of corresponding distinct energy levels of said particle beam.

7. The method according to claim 1, wherein said semiconductor substrate is rotated in a plane parallel to said top surface during said implantation step, the particle rotation causing the beam to impinge on said top surface at a plurality of different azimuth angles.

8. The method according to claim 7, wherein said plurality of distinct angles of incidence and said plurality of azimuth angles of said particle beam are altered continuously during the formation of said implantation layer.

9. The method according to claim 1, further comprising at least one additional implantation layer formation step, using said particle beam or a distinct particle beam with a distinct energy level and a path distance through said substrate, as opposed to said particle beam forming said main implantation peak, for forming at least one secondary implantation peak, in addition to said main implantation peak, at a depth of penetration that is greater than the depth of penetration of said main implantation peak.

10. The method according to claim 9, wherein the at least one secondary implantation peak has a lower impurity concentration than said main implantation peak.

11. The method according to claim 9, wherein the at least one secondary implantation peak has a higher impurity concentration than said main implantation peak.

12. A method of manufacturing a semiconductor diode, wherein at least one of the at least one of a plurality of semiconductor layers is a broadened field stop zone that is generated according to claim 1.

13. A method of manufacturing an IGBT, wherein at least one of the at least one of a plurality of semiconductor layers is a broadened field stop zone that is generated according to claim 1.

14. A method of manufacturing a semiconductor device comprising a semiconductor substrate with at least one field stop zone, comprising:
increasing a path distance of a particle beam through the semiconductor substrate to a main implantation peak; and
increasing an energy level of said particle beam through the semiconductor substrate, therefore forming a field stop zone in the semiconductor substrate, said field stop zone having a first thickness,
wherein said field stop zone is formed at a predetermined depth of penetration relative to a top surface of the semiconductor substrate,
wherein said first thickness of said field stop zone is larger than a thickness of an implantation layer produced at the same predetermined depth of penetration relative to said top surface of the semiconductor substrate while employing a particle beam of non-increased path distance and non-increased energy level,
wherein said particle beam is incident on said top surface of said semiconductor substrate,
wherein a main donor peak is formed at said predetermined depth of penetration as a result of an annealing step carried out at a temperature less than 500° C., after said implantation layer has been formed, and
wherein said path distance is increased by using said particle beam having an angle of incidence different than 90° with reference to said top surface.

15. The method according to claim 14, wherein said particle beam is a proton beam used for proton implantation.

16. The method according to claim 14, wherein said angle of incidence is between 75° and 30°.

17. The method according to claim 14, wherein said angle of incidence is adjusted with reference to said top surface to at least one of a plurality of values, during said formation of the implantation layer between 90° and 10°.

18. The method according to claim 17, wherein said angle of incidence is adjusted to a plurality of values between 75° and 30°.

19. The method according to claim 17, further comprising a plurality of implantation sub-steps using a particle beam with angles of incidence for each sub-step, and a plurality of corresponding distinct energy levels of said particle beam.

20. The method according to claim 17, wherein said plurality of distinct angles of incidence and said plurality of azimuth angles of said particle beam are altered continuously during the formation of said implantation layer.

21. The method according to claim 14, wherein said semiconductor substrate is rotated in a plane parallel to said top surface during said implantation step, the particle rotation causing the beam to impinge on said top surface at a plurality of different azimuth angles.

22. The method according to claim 14, further comprising at least one additional implantation layer formation step, using said particle beam or a distinct particle beam with a distinct energy level and a path distance through said substrate, as opposed to said particle beam forming said main implantation peak, for forming at least one secondary implantation peak, in addition to said main implantation peak, at a depth of penetration that is greater than the depth of penetration of said main implantation peak.

23. The method according to claim 22, wherein the at least one secondary implantation peak has a lower impurity concentration than said main implantation peak.

24. The method according to claim 22, wherein the at least one secondary implantation peak has a higher impurity concentration than said main implantation peak.

25. A method of manufacturing a semiconductor device comprising a semiconductor substrate with at least one field stop zone, comprising:
projecting a particle beam with an angle of incidence on the top surface of the semiconductor substrate; and
increasing an energy level of said particle beam through the semiconductor substrate, therefore forming a field stop zone in the semiconductor substrate, said field stop zone having a first thickness,
wherein said field stop zone is formed at a predetermined depth of penetration relative to a top surface of the semiconductor substrate,
wherein said first thickness of said field stop zone is larger than a thickness of an implantation layer produced at the same predetermined depth of penetration relative to said top surface of the semiconductor substrate while employing a particle beam of non-increased path distance, particle beam incident perpendicular on said tip surface of the substrate and non-increased energy level,
wherein excess material is removed from said top surface of said substrate, until a main implantation peak of said field stop zone is located at said predetermined depth of penetration,
wherein a main donor peak is formed at said predetermined depth of penetration as a result of an annealing step carried out at a temperature less than 500° C., after said implantation layer has been formed, and
wherein said angle of incidence is adjusted to a plurality of values during said implantation step between 90° and 10°, with reference to said top surface.

26. The method according to claim 25, wherein said particle beam is a proton beam used for proton implantation.

27. The method according to claim 25, wherein the angle of incidence is between 75° and 30°.

28. The method according to claim 25, further comprising a plurality of implantation sub-steps using a particle beam with a plurality of distinct angles of incidence for each sub-step and a plurality of corresponding distinct energy levels.

29. The method according to claim 28, wherein the plurality of distinct angle of incidence is adjusted to a plurality of values between 75° and 30°.

30. The method according to claim 28, wherein said plurality of distinct angles of incidence and said plurality of distinct azimuth angles of said particle beam are altered continuously during said implantation step.

31. The method according to claim 25, wherein said semiconductor substrate is rotated in a plane parallel to said top surface during said implantation step, the particle rotation causing the beam to impinge on said top surface at a plurality of different azimuth angles.

32. The method according to claim 25, further comprising at least one additional implantation step using said particle beam or a distinct particle beam with a distinct energy level and a path distance through said substrate, as opposed to said particle beam forming said main implantation peak, for forming at least one secondary implantation peak, in addition to said main implantation peak, at a depth of penetration that is greater than the depth of penetration of said main implantation peak.

33. The method according to claim 32, wherein said secondary implantation peaks have a lower impurity concentration than said main implantation peak.

34. The method according to claim 32, wherein at least one of the at least one secondary implantation peaks has a higher impurity concentration than said main implantation peak.

* * * * *